(12) United States Patent
Jeong et al.

(10) Patent No.: US 9,929,418 B2
(45) Date of Patent: Mar. 27, 2018

(54) SYSTEM AND METHOD FOR DIAGNOSING STATE OF FUEL CELL STACK AND CONTROLLING FUEL CELL SYSTEM

(71) Applicant: Hyundai Motor Company, Seoul (KR)

(72) Inventors: Kwi Seong Jeong, Gyeonggi-Do (KR); Haeng Jin Ko, Seoul (KR); Young Bum Kum, Seoul (KR); Sang Bok Won, Seoul (KR)

(73) Assignee: Hyundai Motor Company, Seoul (KR)

( * ) Notice: Subject to any disclaimer, the term of this patent is extended or adjusted under 35 U.S.C. 154(b) by 423 days.

(21) Appl. No.: 14/556,179

(22) Filed: Nov. 30, 2014

(65) Prior Publication Data

US 2015/0362560 A1    Dec. 17, 2015

(30) Foreign Application Priority Data

Jun. 11, 2014   (KR) ........................ 10-2014-0070475

(51) Int. Cl.
*H01M 8/04* (2016.01)
*H01M 8/04492* (2016.01)
(Continued)

(52) U.S. Cl.
CPC ... *H01M 8/04492* (2013.01); *H01M 8/04559* (2013.01); *H01M 8/04589* (2013.01);
(Continued)

(58) Field of Classification Search
CPC ......... H01M 8/04992; H01M 8/04753; H01M 8/04761; H01M 8/04589; H01M 8/04649; H01M 8/04492; H01M 8/04559; H01M 2250/20; Y02T 90/32; G01R 31/3651; G01R 31/3662
(Continued)

(56) References Cited

U.S. PATENT DOCUMENTS

2003/0204328 A1* 10/2003 Tinnemeyer ....... G01R 31/3606
                                                          702/30
2008/0166609 A1    7/2008 Kitamura
(Continued)

FOREIGN PATENT DOCUMENTS

JP    2008-232758 A    10/2008
JP    2010-251096 A    11/2010
(Continued)

*Primary Examiner* — Gary Harris
(74) *Attorney, Agent, or Firm* — Mintz Levin Cohn Ferris Glovsky and Popeo, P.C.; Peter F. Corless (57) ABSTRACT

A system and method for diagnosing the state of a fuel cell stack are provided. The method includes simultaneously applying currents having respective first and second frequencies to a fuel cell stack and computing Fourier transforms of output currents and voltages from the fuel cell stack based on the applied currents. A real part of a first frequency impedance and an imaginary part of a second frequency impedance are calculated using amplitudes and phases of currents and voltages having the first frequency and the second frequency among the computed output currents and voltages. Further, a state of the fuel cell stack is determined by magnitude of the calculated real part of the first frequency impedance and by magnitude of the calculated imaginary part of the second frequency impedance.

9 Claims, 5 Drawing Sheets

(51) Int. Cl.
  *H01M 8/04746*  (2016.01)
  *H01M 8/04537*  (2016.01)
  *H01M 8/04992*  (2016.01)
  *G01R 31/36*   (2006.01)

(52) U.S. Cl.
  CPC ... *H01M 8/04649* (2013.01); *H01M 8/04753* (2013.01); *H01M 8/04761* (2013.01); *H01M 8/04992* (2013.01); *G01R 31/3651* (2013.01); *G01R 31/3662* (2013.01); *H01M 2250/20* (2013.01); *Y02T 90/32* (2013.01)

(58) Field of Classification Search
  USPC ........................................................ 429/431
  See application file for complete search history.

(56) References Cited

U.S. PATENT DOCUMENTS

2010/0013490 A1\* 1/2010 Manabe ............ H01M 8/04649
                                          324/430
2010/0286939 A1\* 11/2010 Oh .................... G01R 31/3624
                                          702/65

FOREIGN PATENT DOCUMENTS

| JP | 2011-029158 A | 2/2011 |
| KR | 10-0813925 | 3/2008 |
| KR | 10-0936892 | 1/2010 |
| KR | 10-2010-0121354 A | 11/2010 |
| KR | 10-1090705 B1 | 12/2011 |
| KR | 10-1315764 | 10/2013 |
| KR | 10-2013-0127289 A | 11/2013 |

\* cited by examiner

| | Flooding ⇐ | | Normal | ⇒ dry | |
|---|---|---|---|---|---|
| | HH | H | M | L | LL |
| | hydrogen flow ↑<br>air flow ↑<br>hydrogen pressure ↑<br>air pressure ↓<br>emission of ↑ hydrogen | hydrogen flow ↑<br>air flow ↑ | Normal operation condition (optimal operation) | air flow ↓<br>hydrogen pressure ↓ | hydrogen flow ↑<br>air flow ↓<br>hydrogen pressure ↓<br>air pressure ↑ |

SYSTEM AND METHOD FOR DIAGNOSING STATE OF FUEL CELL STACK AND CONTROLLING FUEL CELL SYSTEM

CROSS REFERENCE TO RELATED APPLICATION

The present application claims priority of Korean Patent Application Number 10-2014-0070475 filed on Jun. 11, 2014, the entire contents of which application are incorporated herein for all purposes by this reference.

BACKGROUND

1. Field of the Invention

The present invention relates, generally, to a system and method for diagnosing the state of a fuel cell stack and for controlling a fuel cell system and, more particularly, to a method for diagnosing the state of a fuel cell stack and for controlling a fuel cell system, by which the water content of a fuel cell stack, such as dried-out/flooded states (e.g., water drainage), is determined, using the magnitude of impedance of a multi-frequency current applied to the fuel cell stack.

2. Description of the Related Art

A fuel cell vehicle includes a fuel cell stack, used as a power source, in which multiple fuel cells are combined, a fuel supply system that provides hydrogen to the fuel cell stack, an air supply system that provides oxygen as an oxidant necessary for an electrochemical reaction, and a water and heat management system that adjusts the temperature of the fuel cell stack. The fuel supply system decompresses compressed hydrogen stored in a hydrogen tank and provides the decompressed hydrogen to the fuel electrode (anode) of the stack, and an air supply system provides air suctioned from exterior by an air blower to the air electrode (cathode) of the stack.

When hydrogen and oxygen are provided to the fuel electrode and the air electrode, respectively, hydrogen is divided into a proton and an electron by a catalyst at the fuel electrode, and the proton travels to the air electrode through an electrolyte membrane while the electron is drawn from the anode to the cathode through an external circuit, thus generating electric power. Once reaching the air electrode, the proton is reunited with the electron and reacts with oxygen to create water, thus also generating electric power. In other words, a combination of the electrochemical oxidation of hydrogen at a fuel electrode and the electrochemical reduction of oxygen at an air electrode induces electrons to continuously move from the anode to the cathode, with the concomitant generation of electric power and heat. Additionally, the electrochemical reaction of hydrogen with oxygen generates water vapor or liquid phase water.

An emission device is provided as a drain during the generation of electric power in the fuel cell stack, i.e., the by-products, such as water vapor, water, and heat, and unreacted reactants, such as hydrogen and oxygen. Gas such as water vapor, hydrogen and oxygen is discharged to the atmosphere through a ventilation hood. Components for operating a fuel cell, including an air blower, a hydrogen recirculation blower, a water pump, and the like, are connected to a main bus to facilitate the operation of a fuel cell. The main bus may also be connected with various relays for facilitating power interruption and connection, and a diode for preventing a back current to the fuel cell.

Dry air provided by an air blower is humidified using a humidifier and is provided to the air electrode of a fuel cell stack while exhaust gas from the air electrode is delivered in a humidified state via the water generated within to the humidifier, and is used to humidify the dry air provided by an air blower. When a fuel cell stack is in a dried-out or flooded state, the fuel cell stack decreases in output power and the time required to recover the output power to a proper level increases. In addition, continuation of a dried-out or flooded state may result in a decrease in the durability and lifespan of the fuel cell stack. Therefore, it is necessary to accurately diagnose the state of a fuel cell stack, including dry-out or flooding (e.g., a water drainage state), and to ensure a rapid recovery of the fuel cell stack by performing recovery operations of the stack according to the diagnosed state.

A related art discloses a method for diagnosing the water content of a fuel cell stack by measuring an alternating current (AC) impedance of the fuel cell. In other words, when a current impedance is substantially constant, a fuel cell may be diagnosed as being normal. Further, when the fuel cell exhibits significant variation in current impedance, a flooding of the fuel cell may be determined. A gradually increasing current impedance may indicate that fuel cell is in a dried-out state. This disclosed method requires substantial amount of time to detect flooding since the method determines flooding by determining a variation of an impedance value; however, this requires measuring two or more impedance values over time and computing a variation of the impedance values. Additionally problematic is that measuring an impedance frequency range of several hundred Hz may result in a decrease in precision of measurement.

Another related art discloses a method for preventing a fuel cell stack from drying out by determining the relative humidity of the fuel cell stack using a relative humidity map based on measurement data regarding respective temperatures of a blower outlet, a humidifier inlet, and a coolant outlet, and by reducing an air flow and increasing a driving pressure when the relative humidity is determined to increase. This method is, however, problematic in that because humidity inside a fuel cell stack is highly susceptible to various factors, including the temperature and humidity of air suctioned into the fuel cell stack, the temperature and humidity in an air outlet, the temperature and humidity of provided hydrogen, the amount of product water of the fuel cell stack, and the temperature of the fuel cell stack itself. Estimating the relative humidity from data regarding respective temperatures of the air blower outlet, the humidifier inlet, and the coolant outlet has a reduced degree of accuracy.

Furthermore, another related art discloses a method of recovering a water balance in a fuel cell stack. When a dry-out situation occurs in the fuel cell stack in which the water balance in a fuel cell is less than a predetermined value, the fuel cell stack is recovered by restricting the output of the fuel cell through sequential processes of reduction of an air stoichiometric ratio, reduction of fuel electrode pressure, increase of an fuel electrode circulation volume, and increase of air pressure in that order. However, the sequential processes suffer from the disadvantage of requiring a substantial amount of time to recover a fuel cell stack in a dried-out state.

SUMMARY

Accordingly, the present invention provides a method for diagnosing a state of a fuel cell stack capable of increasing the diagnosis performance of a fuel cell stack by applying a multi-frequency current, measuring the impedance of the multi-frequency current, and rapidly diagnosing the water content of the fuel cell stack, including a dried-out/flooded state of the fuel cell stack. Additionally, the present invention provides a method for controlling a fuel cell system based on the state of a fuel cell stack, the method enabling rapid recovery of a fuel cell stack from an abnormal state to a normal state (e.g., from a dried out or flooded state to a state without failures).

According to one aspect of the present invention, a method for diagnosing the state of a fuel cell stack may include: simultaneously applying currents having respective first and second frequencies to the fuel cell stack; computing Fourier transforms of output currents and voltages from the fuel cell stack based on the applied currents; calculating a real part of a first frequency impedance and an imaginary part of a second frequency impedance using amplitudes and phases of currents and voltages having the first frequency and the second frequency among the computed output currents and voltages; and determining a state of the fuel cell stack by magnitude of the calculated real part of the first frequency impedance and by magnitude of the calculated imaginary part of the second frequency impedance, the first frequency being greater than the second frequency.

The first frequency may be about 100 Hz or greater, and the second frequency may range from about 1 Hz to 100 Hz. The process of determining a state of the fuel cell stack may be performed based on a magnitude of the calculated real part and imaginary part, based on a state map of the fuel cell stack in which states of the fuel cell stack are mapped corresponding to magnitudes of the real part of the first frequency impedance and the imaginary part of the second frequency impedance. The state map of the fuel cell stack shows a relationship between the water content of the fuel cell stack, and levels of the magnitude of the real part of the first frequency impedance and the imaginary part of the second frequency impedance. The levels may be divided based on multiple predetermined boundary values.

The process of determining a state of the fuel cell stack may also include determining a water content of the fuel cell stack based on the level to which the magnitude of the computed real part and imaginary part is subject. Further, the process of determining a state of the fuel cell stack may include using an output of a fuzzy logic based diagnostic tool which implements fuzzy logic in correspondence to a magnitude of a real part of the first frequency impedance and a magnitude of an imaginary part of the second frequency impedance. The output of the fuzzy logic based diagnostic tool may be determined by the magnitude of the real part of the first frequency impedance and the magnitude of the imaginary part of the second frequency impedance, and may be divided into multiple levels based on predetermined boundary values. The process of determining a state of the fuel cell stack may further include determining a water content of the fuel cell stack based on the level divided according to the predetermined boundary values.

The method may further include dividing states of the fuel cell stack into multiple levels based on the determined water content of the fuel cell stack. In addition, the method may include varying multiple factors including an air flow, an air pressure, a hydrogen flow, a hydrogen pressure, and emission of hydrogen of the fuel cell stack, based on the level divided according to the predetermined boundary values. The level may include levels 1 to 5, divided in a descending order of water content according to predetermined values. The process of varying multiple factors may be performed by increasing air flow, hydrogen pressure, hydrogen flow, and emission of hydrogen and decreasing air pressure when the water content of the fuel cell stack is subjected to level 1; increasing hydrogen flow and increasing air flow when the water content of the fuel cell stack is subjected to level 2; decreasing air flow and hydrogen pressure when the water content of the fuel cell stack is subjected to level 4; and increasing hydrogen flow and air pressure and decreasing air flow and hydrogen pressure when the water content of the fuel cell stack is subjected to level 5.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

It is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Specific structural or functional descriptions in the exemplary embodiments of the present invention disclosed in the specification or application are only for description of the exemplary embodiments of the present invention. The descriptions can be embodied in various forms and should not be construed as being limited to the embodiments described in the specification or application. Specific exemplary embodiments are illustrated in the drawings and described in detail in the specification or application because the exemplary embodiments of the present invention may have various forms and modifications. It should be understood, however, that there is no intent to limit the embodiments of the present invention to the specific exemplary embodiments, but the intention is to cover all modifications, equivalents, and alternatives included to the scope of the present invention.

Although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Reference now should be made to the drawings, in which the same reference numerals are used throughout the different drawings to designate the same or similar components.

Figure 1:
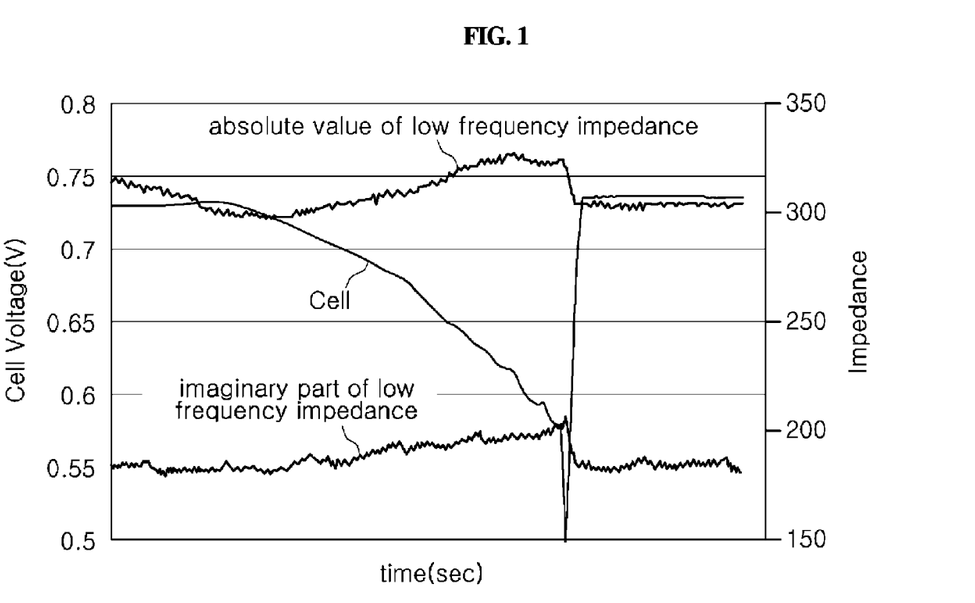
FIG. 1 is an exemplary graph showing change of electrical properties of a fuel cell stack, including cell voltage, absolute value of impedance, and imaginary part of low frequency impedance, with time according to an exemplary embodiment of the present invention.

FIG. 1 shows changes in electrical properties of a fuel cell stack, including cell voltage, absolute value of low frequency impedance, and imaginary part of low frequency impedance, with time. Referring to FIG. 1, a cell voltage sharply decreases with time, when the mass flow rate of hydrogen decreases. In FIG. 1, changes in the magnitude of the absolute value of impedance, and the magnitude of the imaginary part of low frequency impedance are also depicted as a function of time. The magnitude of the absolute value of low frequency impedance decreases and then increases, but the magnitude of the imaginary part of low frequency impedance continues to increase with a decrease in cell voltage. In other words, FIG. 1 explains the superiority in diagnostic accuracy of using the magnitude of an imaginary part of low frequency impedance in diagnosing a state of fuel cell stack based on water content to using the absolute value of low frequency impedance.

Figure 2:
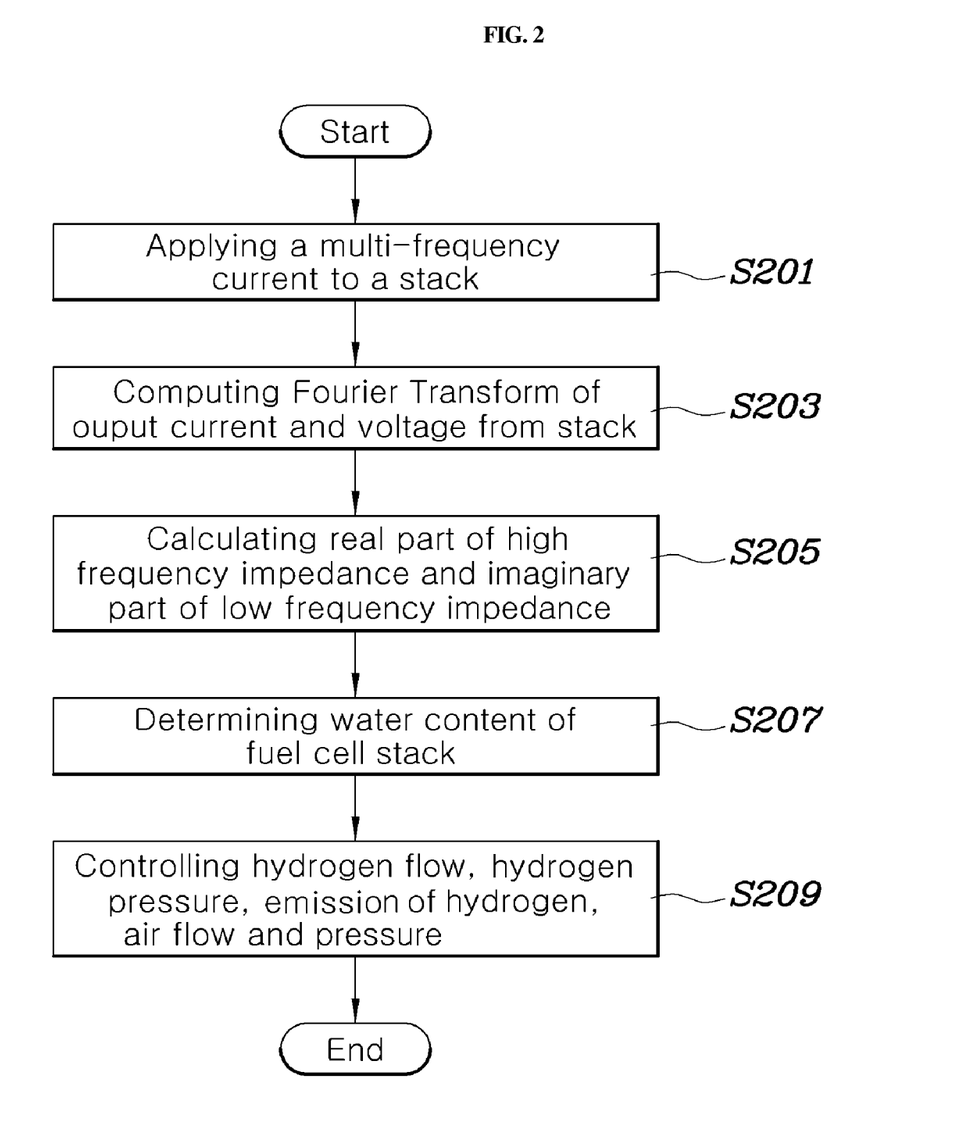
FIG. 2 is an exemplary schematic flow diagram of a method for diagnosing a state of a fuel cell stack according to one exemplary embodiment of the present invention.

FIG. 2 is an exemplary schematic flow diagram showing a method for diagnosing a state of a fuel cell stack in accordance with an exemplary embodiment of the present invention. In the flow diagram each process may be executed by a fuel cell controller or a distributed controller of a fuel cell.

A method for diagnosing a state of a fuel cell stack according to an exemplary embodiment of the present invention may include simultaneously applying, by a controller, currents having respective first and second frequencies (S201), computing, by the controller, Fourier transforms of output currents and voltages from the fuel cell stack based on the applied currents (S203), calculating, by the controller, a real part of a first frequency impedance and an imaginary part of a second frequency impedance using amplitudes and phases of currents and voltages having the first frequency and the second frequency among the computed output currents and voltages (S205), and determining, by the controller, a state of the fuel cell stack by magnitude of the calculated real part of the first frequency impedance and by magnitude of the calculated imaginary part of the second frequency impedance (S207).

In particular, the first frequency may be greater than the second frequency. The first frequency may be a relatively high frequency in comparison with the second frequency and the second frequency may be a relatively low frequency in comparison with the first frequency. A current that synthesizes currents having different frequencies may be applied as a diagnostic current to a fuel cell stack. The first frequency may be about 100 Hz or greater while the second frequency may range from about 1 Hz to less than 100 Hz. When a current that synthesizes a current having a high frequency with a current having a low frequency is applied to a fuel cell stack, output currents and voltages from the fuel cell stack include current and voltage components having the same frequencies as those of the applied current.

For a faster diagnosis of the state of a fuel cell stack, a fuel cell controller may be configured to apply to the fuel cell stack a current which synthesizes multiple currents having different frequencies (e.g., sinusoidal currents having respective first and second frequencies). Then, the fuel cell controller may be configured to measure output currents and voltages from the fuel cell stack. The measured output currents and voltages may be subjected to Fourier transformation to induce conversion to the frequency domain. Each of the measured currents and voltages may have the first frequency and the second frequency. Subsequently, the fuel cell controller may be configured to calculate amplitudes of currents having the first frequency and the second frequency, amplitudes of voltages having the first frequency and the second frequency, a phase angle of the current and voltage having the first frequency, and a phase angle of the current and voltage having the second frequency.

Thereafter, using the amplitude and phase angle of the voltage and current having the first frequency the fuel cell controller may be configured to calculate a real part of the first frequency impedance. Similarly, the fuel cell controller may be configured to calculate an imaginary part of the second frequency impedance from the amplitude and phase angle of the voltage and current having the second frequency. Based on the real part of the first frequency impedance and the imaginary part of the second frequency impedance, the fuel cell controller may be configured to determine a water content of the fuel cell stack to diagnose the state of the fuel cell stack. Based on the diagnosed state, the fuel cell controller may be configured to variably adjust flow rates and pressures of the hydrogen and air provided to the fuel cell stack, or fuzzy logic cycles such as emission cycles of hydrogen. Details in the context of the control will be described, later. Each of the first frequency impedance and the second frequency impedance is expressed in a form of the real part and the imaginary part.

Figure 3:
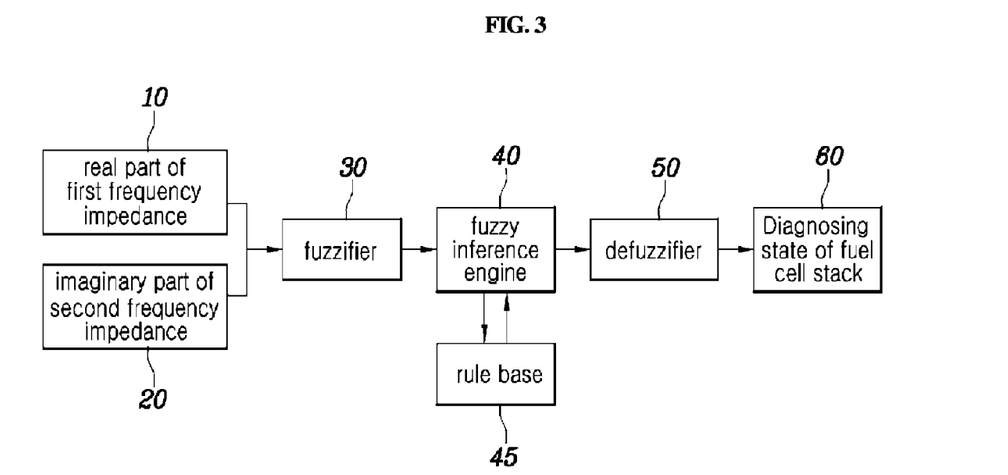
FIG. 3 is an exemplary schematic block diagram of a fuzzy logic based diagnostic tool according to one exemplary embodiment of the present invention.

FIG. 3 is an exemplary schematic block diagram illustrating a fuzzy logic based diagnostic tool according to one exemplary embodiment of the present invention. Given the real part of the first frequency impedance 10 and the imaginary part of the second frequency impedance 20, described in FIG. 2, as inputs, the fuzzy logic based diagnostic tool according to one exemplary embodiment of the present invention may be used to diagnose a state of the fuel cell stack by a fuzzy inference. The fuzzy logic based diagnostic tool may include: a fuzzifier 30, a fuzzy inference engine 40, a rule base 45, and a defuzzifier 50. The fuzzy logic based diagnostic tool may be configured to diagnose a state of a fuel cell stack by processes of inputting numerical values, converting the input to a fuzzy language by the fuzzifier 30, determining a set of fuzzy rules and outputting a fuzzy language by the fuzzy inference engine 40, and converting the fuzzy rules to a numerical output by defuzzifier 50.

The fuzzy rule base 45 may be used for fuzzy inference, in which, as a rule, one output is derived from the two inputs, that is, a real part of the first frequency impedance 10 and an imaginary part of the second frequency impedance 20, representing a state of the fuel cell stack. When the real part of the first frequency impedance 10 and the imaginary part of the second frequency impedance 20 are numerically input to a fuzzifier, the input may be converted to a linguistic fuzzy variable such as "high" or "low," etc. Given the fuzzy variable as a linguistic input, the fuzzy inference engine 40 may be configured to output a linguistic fuzzy control variable which is then difuzzified to a numerical control variable to diagnose a state of the fuel cell stack by the defuzzifier 50.

Figure 4:
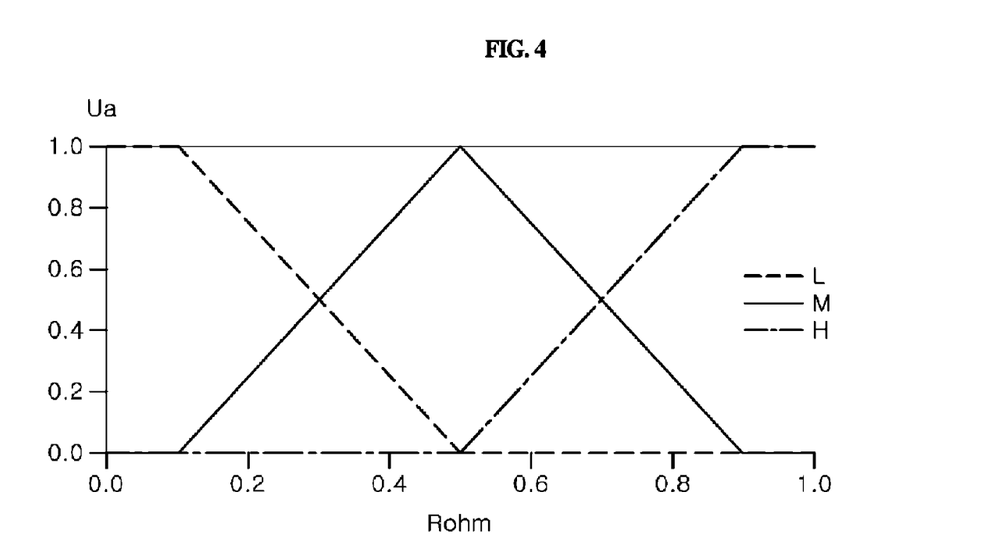
FIG. 4 is an exemplary view of a fuzzy membership function according to the magnitude of the real part of a first frequency impedance, as measured by a fuzzy logic based diagnostic tool according to one exemplary embodiment of the present invention.
Figure 5:
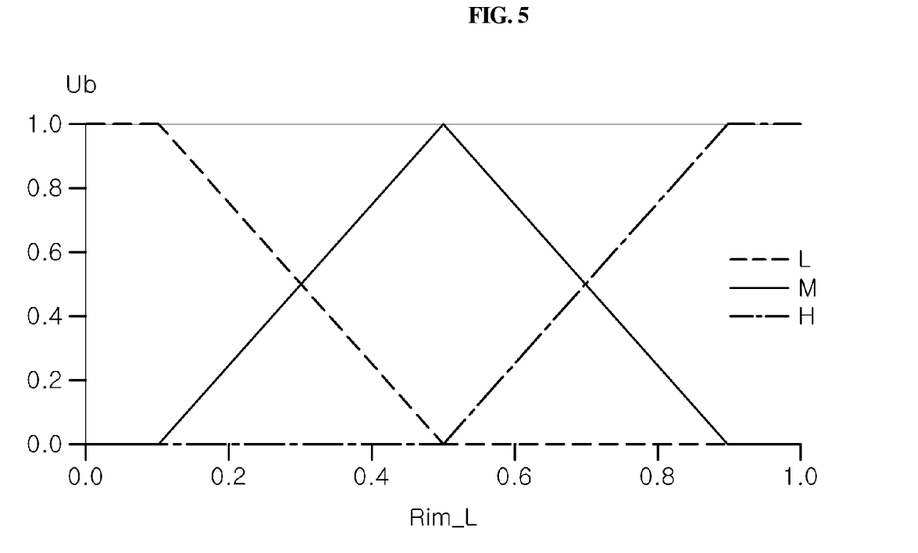
FIG. 5 is an exemplary view of a fuzzy membership function according to the magnitude of the imaginary part of a first frequency impedance, as measured by a fuzzy logic based diagnostic tool according to one exemplary embodiment of the present invention.

A fuzzy logic controller may have two inputs and one output that correspond to the fuzzy rule base 45. The two inputs may be a real part of the first frequency impedance 10 and an imaginary part of the second frequency impedance 20. A real part of the first frequency impedance 10 may be normalized, with a maximum value and a minimum value set as "1" and "0", respectively. Likewise, an imaginary part of the second frequency impedance may be normalized, with a maximum value and a minimum value set as "1" and "0", respectively. FIG. 4 illustrates a fuzzy membership function according to the magnitude of the real part of the first frequency impedance 10 while FIG. 5 illustrates a fuzzy membership function according to the magnitude of the imaginary part of the second frequency impedance 20. The real part of the first frequency impedance 10 and the imaginary part of the second frequency impedance 20 may be converted to fuzzy values by the fuzzifier 30 and may be input to the fuzzy inference engine 40.

Figure 6:
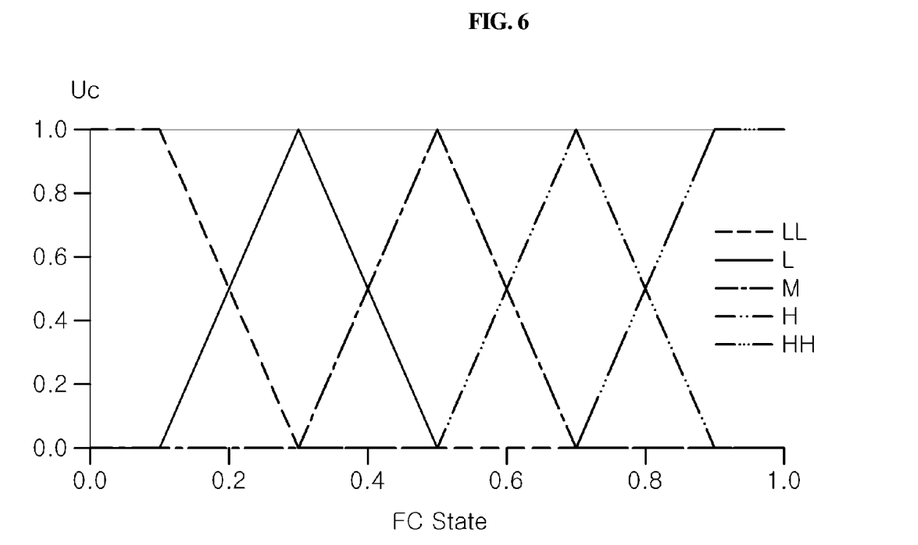
FIG. 6 is an exemplary view of fuzzy membership functions according to the state of a fuel cell stack, as measured by a fuzzy logic based diagnostic tool according to one exemplary embodiment of the present invention.

An output of the fuzzy logic based diagnostic tool may represent a state of the fuel cell stack. For a dried-out state which indicates a decreased water content of the fuel cell stack, the output of the fuzzy logic based diagnostic tool may be expressed "1" in a normalized value whereas for a flooded state indicative of an increased water content of the fuel cell stack, the output of a fuzzy logic based diagnostic tool may be normalized to "0." FIG. 6 illustrates fuzzy membership functions according to the state of a fuel cell stack. The fuzzy inference engine 40 may be configured to determine linguistic outputs using the predetermined fuzzy rule base 45 and two input fuzzy membership functions, and may be configured to compute a state of the fuel cell stack using an output fuzzy membership function.

However, the fuzzy logic based diagnostic tool is merely one tool which outputs a state of a fuel cell stack when given a real part of the first frequency impedance 10 and an imaginary part of the second frequency impedance as inputs, and may use a state map of the fuel cell stack in which a state of a fuel cell stack is mapped corresponding to the magnitude of a real part of the first frequency impedance 10 and the magnitude of an imaginary part of the second frequency impedance 20.

Further, an IF-THEN rule stipulated by the fuzzy rule base of the fuzzy logic based diagnostic tool may be summarized as follows. A degree of water content that corresponds to the magnitude of a real part of the first frequency impedance 10 and the magnitude of an imaginary part of the second frequency impedance 20 may be classified into five levels. The magnitude of a real part of the first frequency impedance 10 and the magnitude of an imaginary part of the second frequency impedance 20 may each be divided to three levels (L, M, H) according to predetermined boundary values as shown in the graphs of FIGS. 4-6. In other words, based on levels to which the magnitudes of a real part of the first frequency impedance 10 and an imaginary part of the second frequency impedance 20 are respectively subject, the water content of a fuel cell stack may be classified into five levels: level 1 indicative of a most-flooded state (HH) to level 5 indicative of a most dried-out state (LL), between which there are level 2 indicative of a state less flooded (H) than level 1, level 4 indicative of a state less dried-out (L) than level 5, and level 3 indicative of a normal state (e.g., a state in which no flooding or dry out is experienced).

First, when the first frequency impedance 10 has a substantially low real part (L) and the second frequency impedance 20 has a substantially high imaginary part (H), the fuel cell stack may be determined to be in a most-flooded state (HH). In other words, when a real part of an first frequency impedance 10 is substantially low (L) and an imaginary part of second frequency impedance 20 is substantially high (H), the output of the fuzzy logic based diagnostic tool corresponds to level 1, indicating that the fuel cell stack is in a most-flooded state (HH).

When the first frequency impedance 10 has a substantially low real part (L) and the second frequency impedance 20 has a middle imaginary part (M), the fuel cell stack may be determined to be slightly-flooded state (H). In other words, when a real part of first frequency impedance 10 is substantially low (L) and an imaginary part of second frequency impedance 20 is middle (M), the output of the fuzzy logic based diagnostic tool corresponds to level 2, indicating that the fuel cell stack is in a slightly-flooded state (H).

When the first frequency impedance 10 has a substantially low real part (L) and the second frequency impedance 20 has a substantially low imaginary part (L), the fuel stack may be determined to be in a normal state (M). In other words, when both a real part of the first frequency impedance 10 and an imaginary part of the second frequency impedance 20 are substantially low (L), the output of a fuzzy logic based diagnostic tool corresponds to level 3, indicating that the fuel cell stack is in a normal state (M).

When the first frequency impedance 10 has a middle real part (M) and the second frequency impedance 20 has a substantially low (L) or middle (M) imaginary part, the fuel stack may be determined to be in a normal state (M). In other words, when a real part of the first frequency impedance 10 is middle (M) and an imaginary part of the second frequency impedance 20 is substantially low (L) or middle (M), the output of a fuzzy logic based diagnostic tool corresponds to level 3, indicating that the fuel cell stack is in a normal state (M).

When the first frequency impedance 10 has a middle real part (M) and the second frequency impedance 20 has a substantially high imaginary part (H), the fuel cell stack may be determined to be in a slightly dried-out state (L). In other words, when a real part of the first frequency impedance 10 is middle (M) and an imaginary part of the second frequency impedance 20 is substantially high (H), the output of a fuzzy logic based diagnostic tool corresponds to level 4, indicating that the fuel cell stack is in a slightly dried-out state (L).

When the first frequency impedance 10 has a substantially high real part (L H) and the second frequency impedance 20 is a substantially low (L) or middle (M) imaginary part, the fuel cell stack may be determined to be in a dried-out state (L). In other words, when a real part of the first frequency impedance 10 is substantially high (H) and an imaginary part of the second frequency impedance 20 is substantially low (L) or middle (M), the output of the fuzzy logic based diagnostic tool corresponds to level 4, indicating that the fuel cell stack is in a slightly dried-out state (L).

When the first frequency impedance 10 has a substantially high real part (H) and the second frequency impedance has a substantially high imaginary part (H), the fuel cell stack may be determined to be in a most dried-out state (LL). In other words, when a real part of the first frequency impedance 10 is substantially high (H) and an imaginary part of the second frequency impedance 20 is substantially high (H), the output of the fuzzy logic based diagnostic tool corresponds to level 5, indicating that the fuel cell stack is in the most dried-out state (LL).

Herein, the term "high" given to the real part or the imaginary part indicates that the magnitude of the real part or the imaginary part is in a substantially high level among from the three levels (high, middle, low) categorized by predetermined boundary values as seen in FIGS. 4-6. Likewise, the terms "middle," and "low" mean middle (e.g., between the low and high level) and substantially low levels of the magnitude, respectively, among the three categories. Hence, the terms "high," "middle," and "low" do not refer to absolute magnitudes.

Furthermore, a state map of the fuel cell stack may be predetermined according to the following criteria. Similar to the use of the fuzzy logic based diagnostic tool, the state of the fuel cell stack may be divided into five levels, categorized as dried-out (LL, L), flooded (HH, H), and normal states (M). In particular, subdivisions may be created of the dried-out states (LL, L) and the flooded states (HH, H) based on the water content. The magnitude of a real part of the first frequency impedance 10 and the magnitude of an imaginary part of the second frequency impedance 20 may each be divided to three categories (L, M, H) based on predetermined boundary values. The categories may be mapped with a water content state.

A state in which the magnitude of a real part of the first frequency impedance 10 is relatively low (L) and the magnitude of an imaginary part of the second frequency impedance 20 is relatively high (H) may be mapped to a most-flooded state (HH). A state in which the first frequency impedance 10 has a relatively low real part (L) and the second frequency impedance 20 has a relatively middle imaginary part (M) may be mapped to a slightly-flooded state (H). When the magnitude of a real part of the first frequency impedance 10 is relatively low (L) and the magnitude of an imaginary part of the second frequency impedance 20 is relatively low (L), the state may be mapped to a normal state.

Further, when the magnitude of a real part of the first frequency impedance 10 is middle (M) and the magnitude of an imaginary part of the second frequency impedance 20 is middle (M) or relatively low (L), the state may be mapped to a normal state (M). When the magnitude of a real part of the first frequency impedance 10 is middle (M) and the magnitude of an imaginary part of the second frequency impedance 20 is relatively high (H), the state may be mapped to a moderately dried-out state(L). Additionally, when the magnitude of a real part of the first frequency impedance 10 is relatively high (H) and the magnitude of an imaginary part of the second frequency impedance 20 is relatively low (L) or middle (M), the state may be mapped to a moderately dried-out state (L). A state in which the first frequency impedance 10 is a relatively high real part (H) and the second frequency impedance 20 has a relatively high imaginary part (H) may be mapped to the most dried-out state (LL).

Relative magnitudes may be categorized as relatively low values (L), middle values (M), and relatively high values (H) based on predetermined boundary values. By predetermined boundary values, a real part of first frequency impedance 10 and an imaginary part of second frequency impedance 20 may be categorized to multiple levels. Based on levels to which the magnitudes of a real part of the first frequency impedance 10 and an imaginary part of the second frequency impedance 20 are respectively subject, the water content of the fuel cell stack may be diagnosed by the state map.

Figure 7:
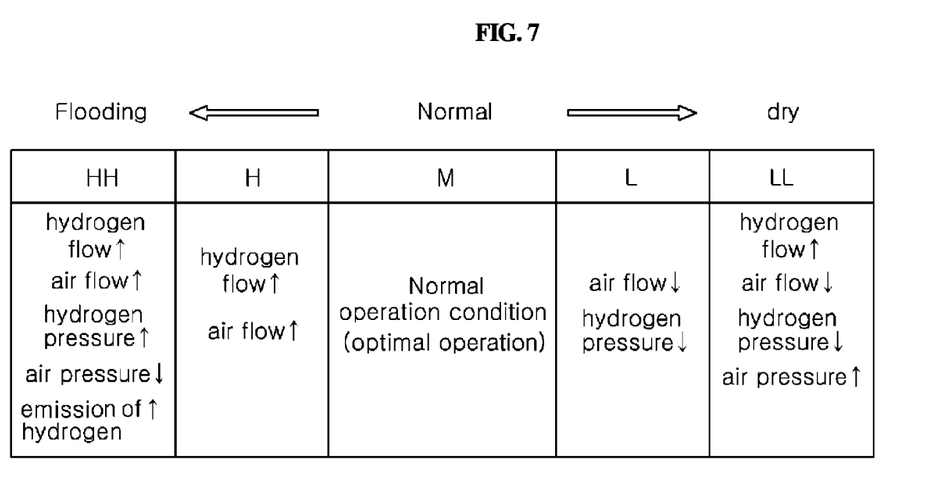
FIG. 7 is an exemplary table summarizing the control of the fuel cell system after diagnosis using a method for diagnosing a state of a fuel cell stack in accordance with one exemplary embodiment of the present invention.

FIG. 7 is an exemplary table summarizing the control of the fuel cell system after diagnosis using a method for diagnosing a state of a fuel cell stack in accordance with one exemplary embodiment of the present invention. As described above, HH stands for the most-flooded state (a first level), H for slightly-flooded state (a second level), M for a normal state (a third level), L for a moderately dried-out state (a fourth level), and LL for the most dried-out state (a fifth level).

When the fuel cell stack is diagnosed as having a state of HH, the fuel cell controller may be configured to increase hydrogen flow, hydrogen pressure, and air flow, and the emission of hydrogen, and decrease air pressure to perform a rapid recovery from the flooded state. For a diagnosed state of H in the fuel cell stack, the fuel cell controller may be configured to increase hydrogen flow and increase air flow. In other words, factors to be adjusted may vary in number and degree based on flooded states of the fuel cell stack.

When the fuel cell stack is diagnosed as M, indicative of a normal state, the state of the fuel cell may be maintained and may be considered a most efficient condition. For a diagnosed state of L in the fuel cell stack, the fuel cell controller may be configured to decrease air flow and hydrogen pressure to avoid a dried-out state. When the fuel cell stack is diagnosed as LL, the fuel cell controller may be configured to increase hydrogen flow and air pressure and decrease air flow and hydrogen pressure to perform a fast recovery from the dried-out state.

In other words, the fuel cell controller may be configured to calculate a real part of the first frequency impedance and an imaginary part of the second frequency impedance using the amplitudes and phases of the first and the second frequency currents and voltages of the currents and voltages output after a current which synthesizes a first frequency and a second frequency may be applied. Then, the fuel cell controller may be configured to determine the water content of the fuel cell stack to diagnose a flooded or dried-out state using a state map in which a relationship between the water content, and the magnitudes of a real part of the first frequency impedance, and an imaginary part of the second frequency impedance may be set.

As described herein, the method for diagnosing a state of a fuel cell stack and for controlling a fuel cell system according to one exemplary embodiment of the present invention may rapidly diagnose the state of a fuel cell stack by simultaneously applying a multi-frequency sinusoidal current to the fuel cell stack, and using impedance, based on the output currents and voltages having different frequencies to determine the state of the fuel cell stack. In addition, by using a real part value of high frequency impedance and an imaginary part of low frequency impedance, instead of an absolute impedance value, to calculate impedance, a more accurate determination of the water content of a fuel cell stack may be possible. Therefore a flooded or dried-out state of a fuel cell stack may be diagnosed more accurately.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for diagnosing a state of a fuel cell stack, comprising:
   simultaneously applying, by a controller, alternating currents having respective first and second frequencies to the fuel cell stack;
   computing, by the controller, Fourier transforms of output currents and voltages from the fuel cell stack based on the applied alternating currents;
   calculating, by the controller, a real part of a first frequency impedance and an imaginary part of a second frequency impedance using amplitudes and phases of currents and voltages having the first frequency and the second frequency among the computed output currents and voltages; and
   determining, by the controller, a state of the fuel cell stack by a magnitude of the calculated real part of the first frequency impedance and by a magnitude of the calculated imaginary part of the second frequency impedance,
   wherein the first frequency is greater than the second frequency,
   wherein the determination of a state of the fuel cell stack includes using an output of a fuzzy logic based diagnostic tool which implements fuzzy logic in correspondence to a magnitude of a real part of the first frequency impedance and a magnitude of an imaginary part of the second frequency impedance, and
   wherein the output of the fuzzy logic based diagnostic tool is determined by the magnitude of the real part of the first frequency impedance and the magnitude of the imaginary part of the second frequency impedance, and is divided into multiple levels based on predetermined boundary values.

2. The method of claim 1, wherein the first frequency is about 100 Hz or greater, and the second frequency ranges from about 1 Hz to 100 Hz.

3. The method of claim 1, wherein the determination of a state of the fuel cell stack is performed based on the magnitude of the calculated real part and imaginary part, based on a state map of the fuel cell stack in which states of the fuel cell stack are mapped corresponding to magnitudes of the real part of the first frequency impedance and the imaginary part of the second frequency impedance.

4. The method of claim 3, wherein the state map of the fuel cell stack shows relationship between water content of the fuel cell stack, and levels of the magnitude of the real part of the first frequency impedance and the imaginary part of the second frequency impedance, the levels being divided according to multiple predetermined boundary values.

5. The method of claim 4, wherein the determination of a state of the fuel cell stack further comprises:
   determining, by the controller, a water content of the fuel cell stack based on the level to which the magnitude of the computed real part and imaginary part is subject.

6. The method of claim 1, wherein the determination of a state of the fuel cell stack further comprises:
   determining, by the controller, a water content of the fuel cell stack based on the level divided according to the predetermined boundary values.

7. The method of claim 5, further comprising:
   dividing, by the controller, states of the fuel cell stack into multiple levels based on the determined water content of the fuel cell stack.

8. The method of claim 7 further comprising:
   varying, by the controller, multiple factors including an air flow, an air pressure, a hydrogen flow, a hydrogen pressure, and emission of hydrogen of the fuel cell stack, based on the level divided according to the predetermined boundary values.

9. The method of claim 8 wherein the level includes levels 1 to 5 divided in a descending order of water content according to predetermined values, and the varying of multiple factors includes:
   increasing, by the controller, air flow, hydrogen pressure, hydrogen flow, and emission of hydrogen and decreasing air pressure, when the water content of the fuel cell stack is subjected to level 1;

increasing, by the controller, hydrogen flow and increase air flow, when the water content of the fuel cell stack is subjected to level 2;

decreasing, by the controller, air flow and hydrogen pressure when the water content of the fuel cell stack is subjected to level 4; and increasing, by the controller, hydrogen flow and air pressure and decreasing air flow and hydrogen pressure when the water content of the fuel cell stack is subjected to level 5.

* * * * *